United States Patent
Lin

(10) Patent No.: US 8,475,979 B2
(45) Date of Patent: Jul. 2, 2013

(54) METHOD OF MANUFACTURING COLOR FILTER SUBSTRATE

(75) Inventor: Hongtao Lin, Beijing (CN)

(73) Assignees: Boe Technology Group Co., Ltd., Beijing (CN); Chengdu Boe Optoelectronics Technology Co., Ltd., Chengdu (CN)

( * ) Notice: Subject to any disclaimer, the term of this patent is extended or adjusted under 35 U.S.C. 154(b) by 0 days.

(21) Appl. No.: 13/277,593

(22) Filed: Oct. 20, 2011

(65) Prior Publication Data

US 2012/0100471 A1   Apr. 26, 2012

(30) Foreign Application Priority Data

Oct. 21, 2010   (CN) .......................... 2010 1 0520814

(51) Int. Cl.
*G02B 5/20* (2006.01)
(52) U.S. Cl.
USPC ............................................................ 430/7
(58) Field of Classification Search
None
See application file for complete search history.

(56) References Cited

U.S. PATENT DOCUMENTS 5,650,867 A * 7/1997 Kojima et al. ................ 349/104
2005/0136342 A1 * 6/2005 Eun et al. .......................... 430/7

FOREIGN PATENT DOCUMENTS

JP         62-253124 A  * 11/1987

* cited by examiner

*Primary Examiner* — John A. McPherson
(74) *Attorney, Agent, or Firm* — Ladas & Parry LLP

(57) ABSTRACT

An embodiment of the present invention provides a method of manufacturing a color filter substrate, comprising: forming a black matrix on a base substrate; and forming color filter patterns having at least two colors on the base substrate on which the black matrix is formed, wherein forming a color filter pattern having one color of the at least two colors, comprising: forming a color filter resin layer having the one color on the base substrate on which the black matrix is formed; radiating the color filter resin layer from a side of the base substrate which is opposite to a side on which the black matrix is formed by using a mask to expose the color filter resin layer so as to form the color filter pattern, wherein light transmitting regions of the mask at least correspond to the color filter pattern to be formed.

8 Claims, 3 Drawing Sheets

METHOD OF MANUFACTURING COLOR FILTER SUBSTRATE

BACKGROUND

Embodiments of the present invention relate to a method of manufacturing a color filter substrate.

Liquid crystal displays (LCDs) are currently common flat panel displays, and a liquid crystal panel is an important part of each of the liquid crystal displays and comprises an array substrate and a color filter substrate assembled together with a liquid crystal layer interposed therebetween.

As shown in FIG. 1, a current method of manufacturing a color filter substrate comprises the following steps: firstly, a black matrix 2 is formed on a base substrate 1, and then, a color filter resin layer 3 is coated on the base substrate 1 on which the black matrix 2 is formed; secondly, the color filter resin layer 3 is radiated by light coming from directly above the color filter resin layer 3 to be exposed using a mask 4, and then, a color filter pattern 5 having a certain color is formed, wherein light transmitting regions or light non-transmitting regions of the mask 4 correspond to the color filter pattern 5 to be fainted on the base substrate 1. A color filter pattern 5 having other color may be formed by using the above method.

With reference to FIGS. 2 and 3, in the current method of manufacturing the color filter substrate, because of a lithograph equipment error, a deformed mask or the like, a alignment error occurs between a mask and a base substrate on which a color filter pattern will be formed, so that overlapping portions between the color filter pattern and two portions of a black matrix being adjacent to the color filter pattern are not symmetrical to each other, even a light leakage occurs and a surface of the color filter substrate is not flat, which influence a printing effect of a alignment solution and an assembling effect of the array substrate and the color filter substrate.

SUMMARY

An embodiment of the present invention provides a method of manufacturing a color filter substrate, comprising: forming a black matrix on a base substrate; and forming color filter patterns having at least two colors on the base substrate on which the black matrix is formed, wherein forming a color filter pattern having one color of the at least two colors, comprising: forming a color filter resin layer having the one color on the base substrate on which the black matrix is formed; radiating the color filter resin layer from a side of the base substrate which is opposite to a side on which the black matrix is formed by using a mask to expose the color filter resin layer so as to form the color filter pattern, wherein light transmitting regions of the mask at least correspond to the color filter pattern to be formed.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

It should be understood that the embodiments described below are only a part of, not all of, the embodiments of the disclosed technology. Based on the described embodiments, any other embodiments accomplished by those skilled in the art without inventive works are fallen within the scope of the disclosed technology also.

A First Embodiment

Figure 1:
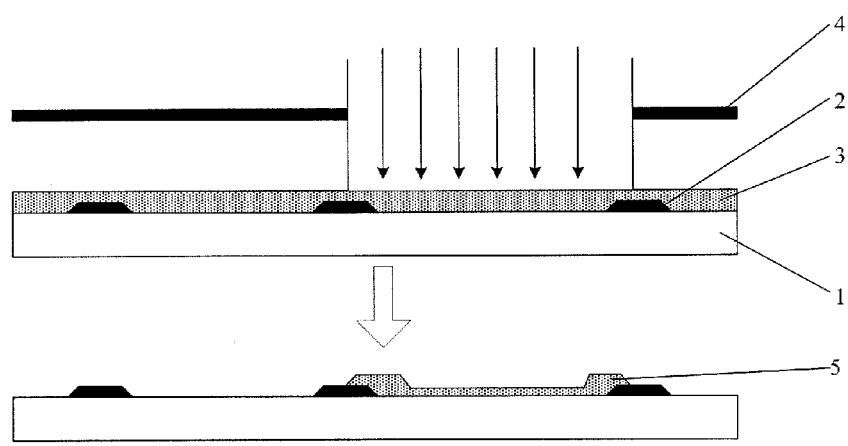
FIG. 1 is a schematic view for showing a current method of manufacturing a color filter substrate.
Figure 2:
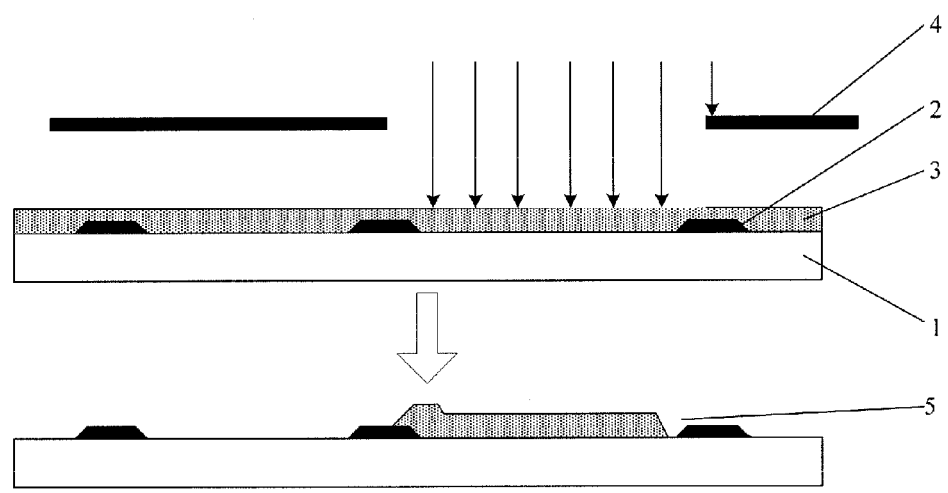
FIG. 2 is a partially side view for showing the color filter substrate when a alignment deviation occurs in the method of manufacturing a color filter substrate shown in FIG. 1.
Figure 3:
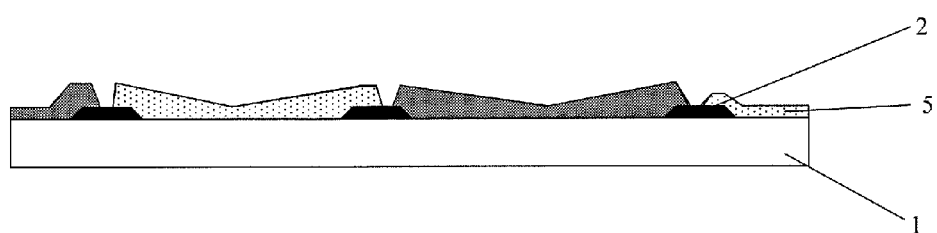
FIG. 3 is a partially side view for showing the color filter substrate formed by using the method of manufacturing a color filter substrate shown in FIG. 1.
Figure 4:
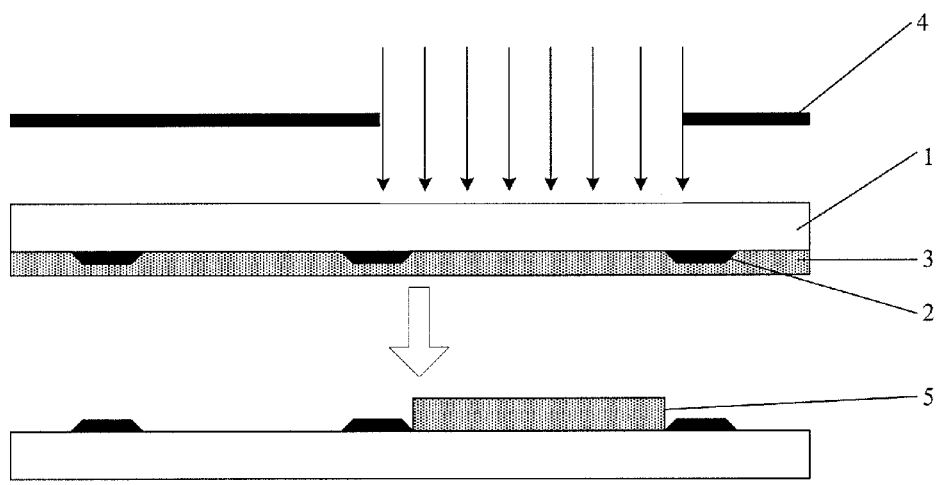
FIG. 4 is a schematic view for showing a method of manufacturing a color filter substrate according to a first embodiment of the present invention.

FIG. 4 is a schematic view for showing a method of manufacturing a color filter substrate according to a first embodiment of the present invention. As shown in FIG. 4, the method of manufacturing the color filter substrate comprises forming a black matrix 2 and color filter patterns 5 having at least two colors on a base substrate 1, wherein forming a color filter pattern 5 having one of the at least two colors comprises: forming a color filter resin layer 3 having the corresponding color on the base substrate 1 on which the black matrix 2 is formed; and then, radiating the color filter resin layer 3 from a side of the base substrate 1 which is opposite to a side on which the black matrix 2 is formed to expose the color filter resin layer 3 using a mask 4 in order to form the color filter pattern 5, wherein edges of each of light transmitting regions of the mask 4 are completely aligned with edges of the color filter pattern 5 to be formed or fall within a range of the black matrix 2.

In the method of manufacturing the color filter substrate according to the present embodiment, the color filter resin layer is radiated by light from a side of the base substrate which is opposite to a side on which the black matrix is formed and is thus exposed in order to form the color filter pattern, and thus, a occurrence of unsymmetrical heights of overlapping portions between the color filter pattern and two portions of the black matrix at both sides of the color filter pattern caused by an alignment error between a mask and the base substrate is avoided, and a light leakage is prevented. Therefore, the color filter pattern is not overlapped with the black matrix, so that a surface of the color filter substrate becomes flat, the light leakage is prevented, a printing effect of an alignment solution and an assembling effect of the array substrate and the color filter substrate are improved.

Herein, forming the black matrix 2 on the base substrate 1 may use the current technology, and after a formation of the black matrix 2, a color filter resin layer 3 with a certain color is formed on the base substrate 1 on which the black matrix 2 is formed, and then, by using a mask 4, the color filter resin layer 3 is radiated by light from a side of the base substrate 1 which is opposite to a side on which the black matrix 2 is formed and is thus exposed. In detail, steps for forming a color filter pattern 5 with a first color comprising:

Forming a color filter resin layer 3 with the first color on the base substrate 1 on which the black matrix 2 is formed, wherein a mask 4 is disposed to face the base substrate 1 so that the black matrix 2 and the base substrate 1 are sequentially positioned between the color filter resin layer 3 and the mask 4 from the color filter resin layer 3 side.

During a exposing process, light non-transmitting regions of the mask 4 block the light from radiating onto the color filter resin layer 3. In addition, because the black matrix 2 being not transparent is positioned between the mask 4 and the color filter resin layer 3, the black matrix 2 also blocks the light from radiating onto the color filter resin layer 3.

In the current process for forming the color filter pattern 5, regions radiated by light of the color filter resin layer 3 may be remained and regions thereof being not radiated by the light may be removed; otherwise, the regions of the color filter resin layer 3 radiated by light may be removed and the regions being not radiated by light may be remained. However, in an embodiment of the present invention, because the light is radiated from a side of the base substrate 1 which is opposite to a side on which the black matrix 2 is formed to expose the color filter resin layer 3, the black matrix 2 being not transparent blocks the light from radiating onto the color filter resin layer 3. Further, because the color filter resin layer positioned between two adjacent portions of the black matrix need to be remained to form the color filter pattern 5 and the color filter resin layer positioned directly above the black matrix 2 need to be removed, and the color filter resin layer positioned directly above the black matrix 2 is blocked from being radiated by the light due to the black matrix 2, if regions of the mask 4 positioned directly above the color filter resin layer between the adjacent portions of the black matrix are light non-transmitting regions, both the color filter resin layer positioned directly above the black matrix 2 and the color filter resin layer positioned between the adjacent portions of the black matrix 2 are blocked from being radiated by the light, that is, the overall color filter resin layer 3 is blocked from being radiated by the light, and thus, it is not possible to form the color filter pattern 5. Therefore, it is noted that regions of the mask 4 positioned directly above the color filter resin layer between the adjacent portions of the black matrix 2 are light transmitting regions.

Because the regions of the mask 4 positioned directly above the color filter resin layer between the adjacent portions of the black matrix are light transmitting regions and the color filter resin layer between the adjacent portions of the black matrix 2 needs to be remained to form the color filter pattern 5, the color filter resin layer 3 can be formed from a negative photoresist or a negative photoresist layer is applied on the color filter resin layer 3, so that after transmitting through the light transmitting regions of the mask 4, light is radiated onto the color filter resin layer between the adjacent portions of the black matrix 2, the color filter resin layer radiated by the light is remained and the color filter resin layer positioned directly above the black matrix 2, which is blocked from being radiated by the light due to the black matrix 2, is removed.

During a formation of the color filter pattern 5 having one color, the mask 4 needs to be disposed in a manner that the light transmitting regions of the mask 4 correspond to the color filter pattern 5 to be formed, that is, edges of each of the light transmitting regions of the mask 4 are completely aligned with edges of the color filter pattern 5 to be formed. Otherwise, because the color filter pattern 5 is positioned between two adjacent portions of the black matrix 2, and in order to ensure that the color filter pattern 5 is completely filled between the two adjacent portions of the black matrix 2 and a gap is not formed between the black matrix 2 and the color filter pattern 5 so that a light leakage is prevented, each of the light transmitting regions of the mask 4 should be slightly larger than the corresponding color filter pattern 5 to be formed. That is to say, edges of each of light transmitting regions of the mask 4 are positioned within a range of the black matrix 2 adjacent to the color filter pattern 5.

In the above mentioned method, the color filter resin layer directly above the black matrix 2 is not radiated by the light due to a blockage of the black matrix 2 so as to be completely removed and the color filter resin layer between the two adjacent portions of the black matrix 2 is remained because of the radiation of the light. Thus, the color filter pattern 5 is formed between the two adjacent portions of the black matrix 2, and because the color filter resin layer directly above the black matrix 2 is completely removed, the color filter pattern 5 is not overlapped with the black matrix 2. Thus, in a resultant surface of the color filter substrate, depressions are formed only directly above the black matrix 2, the heights of the color filter patterns 5 are uniform and the black matrix 2 and the color filter pattern 5 are not overlapped to each other to form projections.

Figure 5:
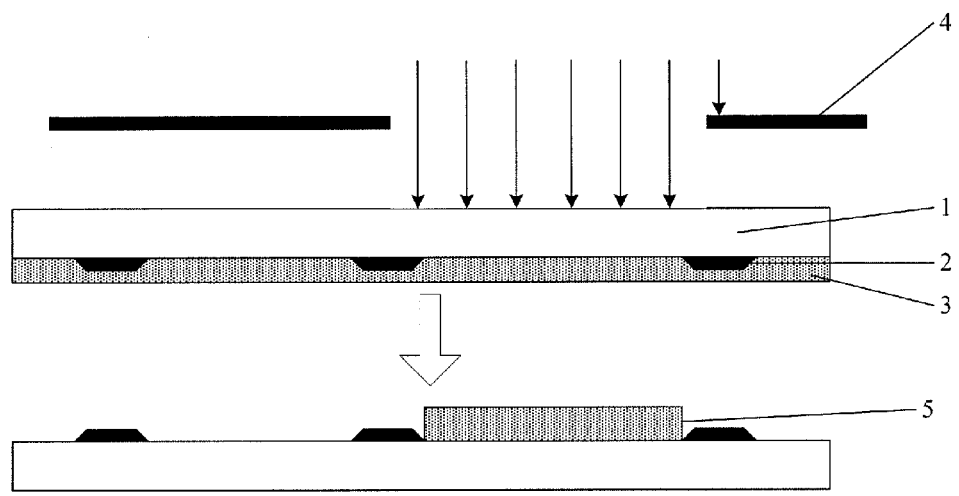
FIG. 5 is a partially side view for showing the color filter substrate when a alignment deviation occurs in the method of manufacturing the color filter substrate shown in FIG. 4.
Figure 6:
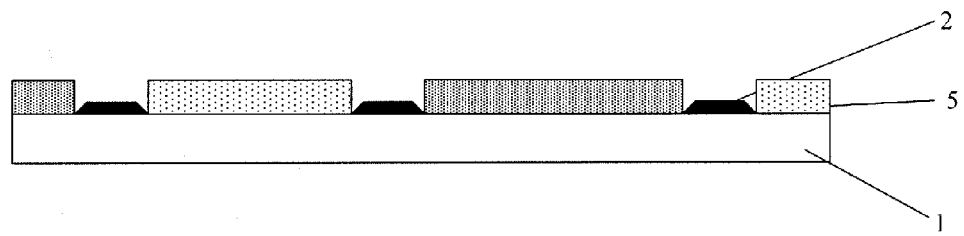
FIG. 6 is a partially side view for showing the color filter substrate formed by using the method of manufacturing the color filter substrate shown in FIG. 4.

During a exposing process, the precise of an alignment of the mask 4 and the base substrate 1 is generally relatively high, however, because of lithograph equipment errors or the deformed mask 4, an alignment deviation may occurs between the mask 4 and the base substrate 1. With reference to FIGS. 5 and 6, the color filter resin layer 3 is radiated by light from a side of the base substrate 1 which is opposite to a side on which the black matrix 2 is formed and is thus exposed by using the mask 4. The black matrix 2 being not transparent is positioned between the base substrate 1 and the mask 4, and thus, the black matrix 2 functions as an assistant mask. Even in the case that edges of each of light transmitting regions of the mask 4 are greatly exceeded outward from edges of the color filter pattern 5, because the light is blocked by the black matrix 2 being not transparent, the color filter resin layer directly above the black matrix 2 can be completely removed so that the black matrix 2 and the color filter pattern 5 are not overlapped, and thus, it is not possible for the heights of overlapping portions between the color filter pattern and two portions of the black matrix 2 being adjacent to the color filter pattern to be different from each other, and in turns, pattern offset also does not occur and a printing effect of a alignment solution and a assembling effect are not influenced.

After a formation of the color filter pattern 5 having one color, by using the above mentioned method, a color filter resin layer 3 having another color is firstly formed on the base substrate 1, and then by using a mask, the color filter resin layer 3 is radiated by light from the side of the base substrate 1 which is opposite to the side on which the black matrix 2 is formed and is thus exposed. Herein, light non-transmitting regions of the mask block the light from radiating onto the color filter pattern 5 which is already formed and light transmitting regions thereof are positioned directly above a color filter pattern to be formed, and edges of each of light transmitting regions of the mask are completely aligned with edges of the color filter pattern to be formed or are positioned within a range of the black matrix 2.

It is noted that after the formation of the color filter pattern 5 having one color, the color filter pattern 5 needs to be post baked so that only a chemical substance with a extreme high concentration and a relatively long time can be used to remove the post baked color filter pattern 5. Therefore, during a formation of the color filter pattern 5 having another color, the formed color filter pattern 5 positioned below the color filter resin layer having another color can not be removed together with the color filter resin layer having another color.

A Second Embodiment

Based on the first embodiment, steps for forming the black matrix 2 on the base substrate 1 in detail comprising:

Depositing a black matrix material layer on the base substrate 1;

Coating a positive photoresist layer on the black matrix material layer;

By using a mask, radiating the black matrix material layer from a side of the base substrate 1 on which the black matrix material layer is formed to expose the black matrix material layer, and then, forming a photoresist pattern corresponding to the black matrix by a developing process, wherein light non-transmitting regions of the mask correspond to the black matrix;

Etching the black matrix material layer to form the black matrix;

Removing the positive photoresist layer on a surface of the black matrix.

Alternatively, the steps for forming the black matrix 2 on the base substrate 1 in detail comprising:

Depositing a black matrix material layer on the base substrate 1;

Coating a negative photoresist layer on the black matrix material layer;

By using a mask, radiating the black matrix material layer from the side of the base substrate 1 on which the black matrix material layer is formed to expose the black matrix material layer, and then, forming a photoresist pattern corresponding to the black matrix by a developing process, wherein light transmitting regions of the mask correspond to the black matrix;

Etching the black matrix material layer to form the black matrix;

Removing the negative photoresist layer on a surface of the black matrix.

Each of the above two methods is a method in which the black matrix 2 is formed by applying a photoresist layer on the black matrix material layer, exposing and developing the photoresist layer and then etching the black matrix material layer. Another general process for forming the black matrix 2 comprise the steps: applying a black photoresist layer on the base substrate 1, and then by using a mask, radiating the black photoresist layer from the side of the base substrate 1 on which the black photoresist layer is formed to exposed the black photoresist layer, and then, forming the black matrix 2 by using a developing process. The number of steps of the latter method is relatively small, and process thereof is simple, which can reduce the manufacturing cost and improve the production efficiency.

The color filter resin layer positioned between two adjacent portions of the black matrix need to be remained to form the color filter pattern 5 and regions of the mask 4 positioned directly above the color filter resin layer between the two adjacent portions of the black matrix 2 should be light transmitting regions, and thus, as a preferred embodiment of the present invention, the steps for forming the color filter pattern 5 by radiating the color filter resin layer 3 from the side of the base substrate 1 which is opposite to the side on which the black matrix 2 is formed to expose the color filter resin layer 3 in detail comprising:

Applying a negative photoresist layer on a surface of the color filter resin layer 3;

By using a mask 4, radiating the color filter resin layer 3 from a side of the base substrate 1 which is opposite to a side on which the black matrix 2 is formed to expose the negative photoresist layer, and then forming a photoresist pattern corresponding to the color filter pattern 5 to be formed on the surface of the color filter resin layer 3 by a developing process;

Etching the color filter resin layer 3 to form the color filter pattern 5;

Removing the negative photoresist layer on a surface of the color filter pattern 5.

More specifically, the mask 4 is positioned at the side of the base substrate 1 which is opposite to the side on which the black matrix 2 is formed, and thus, the black matrix 2 and the base substrate 1 are sequentially positioned between the color filter resin layer 3 and the mask 4 from the color filter resin layer 3 side. Therefore, during a exposing process, the negative photoresist layer on a surface of the color filter resin layer 3 is blocked by both light non-transmitting regions of the mask 4 and the black matrix 2 from being radiated by the light, the negative photoresist layer being not radiated by the light is removed and the negative photoresist layer radiated by the light is remained after a developing process. Because regions of the mask 4 positioned directly above the color filter resin layer between two adjacent portions of the black matrix 2 are light transmitting regions, the negative photoresist layer corresponding to the regions of the mask 4 on a surface of the color filter resin layer 3 is remained due to radiation of the light, and the negative photoresist layer positioned directly above the black matrix 2 on a surface of the color filter resin layer 3 is removed due to the blockage of the black matrix 2.

Thus, after a developing process, a photoresist pattern corresponding to the color filter pattern 5 to be formed is formed on a surface of the color filter resin layer 3. During an etching process, the color filter resin layer on which the negative photoresist layer is remained is remained due to the protection of the negative photoresist layer and the color filter resin layer on which the negative photoresist layer is removed is etched off. After the etching process, the color filter pattern 5 having one color is formed on a surface of the base substrate 1.

Herein, the mask 4 is disposed in a manner that edges of each of light transmitting regions of the mask 4 are completely aligned with edges of the color filter pattern 5 to be formed. Alternatively, because the color filter pattern 5 is positioned between two adjacent portions of the black matrix 2, and in order to ensure that the color filter pattern 5 is completely filled between the two adjacent portions of the black matrix 2 and a gap is not formed between the black matrix 2 and the color filter pattern 5 so that a light leakage is prevented, each of the light transmitting regions of the mask 4 should be slightly larger than the corresponding color filter pattern 5 to be formed. That is to say, edges of each of light transmitting regions of the mask 4 are positioned within a range of the black matrix 2 adjacent to the color filter pattern 5.

In the above mentioned method, after the developing process, the negative photoresist layer on a surface of the color filter resin layer directly above the black matrix 2 is not radiated by the light due to blockage of the black matrix 2 so as to be completely removed and the negative photoresist layer on a surface of the color filter resin layer between two adjacent portions of the black matrix 2 is remained because of the radiation of the light. Thus, after the developing process, the photoresist pattern is formed between the two adjacent portions of the black matrix 2, and because the negative photoresist layer on a surface of the color filter resin layer directly above the black matrix 2 is completely removed, the color filter pattern 5 formed by a etching process is not overlapped with the black matrix 2, and thus, in a resultant surface of the color filter substrate, depressions are formed only directly above the black matrix 2, the heights of the color filter patterns 5 are uniform and the black matrix 2 and the color filter pattern 5 are not overlapped to each other to form projections.

Alternatively, as a more preferred embodiment of the present invention, the steps for forming the color filter pattern 5 by radiating the color filter resin layer 3 from a side of the base substrate 1 which is opposite to a side on which the black matrix 2 is formed by using a mask to expose the color filter resin layer 3 in detail comprising:

by using a mask 4, radiating the color filter resin layer 3 from the side of the base substrate 1 on which the black matrix layer is formed to expose the color filter resin layer 3, and then, forming the color filter pattern 5 by a developing process, wherein the color filter resin layer is formed from a negative photosensitive material.

Because the color filter resin layer is formed from the negative photosensitive material, and after being radiated by the light, the negative photosensitive material can be remained by using a developing process, and if the negative photosensitive material is not radiated with the light, it can be removed by using a developing process. Thus, by using the above forming method, the number of steps of the manufacturing process can be reduced and the production efficiency can be improved.

In the above mentioned method, after a developing process, the color filter resin layer directly above the black matrix 2 is not radiated by the light due to blockage of the black matrix 2 so as to be completely removed and the color filter resin layer between two adjacent portions of the black matrix 2 is remained because of the radiation of the light. Thus, after a developing process, the color filter pattern 5 is formed between the two adjacent portions of the black matrix 2, and because the color filter resin layer directly above the black matrix 2 is completely removed, the color filter pattern 5 formed by the developing process is not overlapped with the black matrix 2, and thus, in a resultant surface of the color filter substrate, depressions are formed only directly above the black matrix 2, the heights of the color filter patterns 5 are uniform and the black matrix 2 and the color filter pattern 5 are not overlapped to each other to form projections.

After a formation of the color filter pattern 5 having one color, by using the above mentioned method, a color filter resin layer 3 having another color is formed on the base substrate 1, and then, radiating the color filter resin layer 3 from a side of the base substrate 1 which is opposite to a side on which the black matrix 2 is formed to expose the color filter resin layer 3 by using a mask. Herein, light non-transmitting regions of the mask block the light from radiating onto the color filter pattern 5 which is already formed and light transmitting regions thereof are positioned directly above the color filter pattern 5 to be formed, and edges of each of light transmitting regions of the mask are completely aligned with edges of the color filter pattern 5 or are positioned within a range of the black matrix 2. After a developing process, the color filter pattern 5 having a corresponding color is formed.

During an exposing process, because of lithograph equipment errors or the deformed mask, an alignment deviation may occur between the mask and the base substrate 1. With reference to FIGS. 5 and 6, the color filter resin layer 3 is radiated by light from the side of the base substrate 1 which is opposite to the side on which the black matrix 2 is formed and is thus exposed by using the mask 4, and the black matrix 2 being not transparent is positioned between the base substrate 1 and the mask 4, and thus, the black matrix 2 functions as an assistant mask. Even in the case that edges of each of light transmitting regions of the mask 4 are greatly exceeded outward from edges of the color filter pattern 5, because the light is blocked by the black matrix 2 being not transparent, the color filter resin layer or the negative photoresist layer on a surface thereof directly above the black matrix 2 can be completely removed so that the black matrix 2 and the color filter pattern 5 are not overlapped, and thus, it is not possible for the heights of overlapping portions between the color filter pattern and two portions of the black matrix being adjacent to the color filter pattern to be different from each other, and in turns, pattern offset also does not occur and a printing effect of a alignment solution and a assembling effect are not influenced.

A Third Embodiment

Based on the second embodiment, steps for forming an color filter substrate in detail comprising:

Placing a base substrate on a stage, and before this step, a cleaning and a drying of the base substrate are commonly performed to ensure a surface of the base substrate free of impurity;

Applying a black photoresist layer on the base substrate;

By using a mask, radiating the black photoresist layer from a side of the base substrate on which the black photoresist layer is formed to expose the black photoresist layer, and forming the black matrix by a developing process.

The above mentioned method is only a preferred method for forming the black matrix, and actually, other methods can be used to form the black matrix on the base substrate.

After a formation of the black matrix on the base substrate, steps for forming a color filter pattern having one color in detail comprising:

Cleaning a surface of the base substrate on which the black matrix is formed;

Forming a color filter resin layer having one color on the base substrate on which the black matrix is formed;

Vacuum drying the base substrate;

Pre-baking the color filter resin layer;

Cooling the color filter resin layer;

Rotating the base substrate by 180 degrees to turn over the base substrate so as to bring the color filter resin layer in contact with the stage;

By using a mask, radiating the color filter resin layer from a side of the base substrate which is opposite to a side on which the black matrix is formed to expose the color filter resin layer in order to forming the color filter pattern by a developing process, wherein edges of each of light transmitting region of the mask are completely aligned with edges of the color filter pattern to be formed or are positioned within a range of the corresponding black matrix 2;

Post baking the formed color filter pattern;

Testing the formed color filter pattern, and if the formed color filter pattern is qualified, the following is to form a color filter pattern having another color.

It is seen that general steps of forming a color filter pattern having a color comprising: placing a substrate→cleaning a surface of the substrate→applying a photoresist layer→Vacuum drying→pre-baking→cooling→exposing→developing→post baking→testing and so on. Herein, after the substrate is turned over, the color filter resin layer is in contact with the stage, the black matrix and the base substrate are sequentially positioned above the color filter resin layer. The mask is disposed directly above the base substrate in a manner that light transmitting regions of the mask correspond to the color filter pattern to be formed, and then, the color filter resin layer is exposed. The color filter resin layer is blocked from being radiated with the light due to both the light non-transmitting regions of the mask directly above the base substrate and the black matrix being not transparent.

After a developing process, the color filter resin layer directly above the black matrix is not radiated by the light due to blockage of the black matrix so as to be completely removed and the color filter resin layer between two adjacent portions of the black matrix is remained because of the radiation of the light. Thus, after a developing process, the color filter pattern is formed between the two adjacent portions of the black matrix, and because the color filter resin layer directly above the black matrix is completely removed, the formed color filter pattern is not overlapped with the black matrix, and thus, in a resultant surface of the color filter substrate, depressions are formed only directly above the black matrix, the heights of the color filter patterns are uniform and the black matrix and the color filter pattern are not overlapped to each other to form projections.

Even in the case that edges of light transmitting regions of the mask are greatly exceeded outward from edges of the color filter pattern due to a alignment error, because the light is blocked by the black matrix being not transparent, the color filter resin layer directly above the black matrix can be completely removed so that the black matrix and the color filter pattern are not overlapped, and thus, it is not possible for the heights of overlapping portions between the color filter pattern and two portions of the black matrix being adjacent to the color filter pattern to be different from each other, and in turns, pattern offset also does not occur and a printing effect of a alignment solution and a assembling effect are not influenced.

After a formation of the color filter pattern having one color, steps for forming a color filter pattern having another color in detail comprising:

Rotating the base substrate on which the color filter pattern having the one color is formed by 180 degrees to turn over the base substrate so as to bring the color filter resin layer having another color in contact with the stage;

By using a mask, radiating the color filter resin layer from a side of the base substrate which is opposite to a side on which the black matrix is formed to expose the color filter resin layer, and forming the color filter pattern by using a developing process, wherein edges of each of light transmitting regions of the mask are completely aligned with edges of the color filter pattern to be formed or are within a range of a corresponding black matrix.

Only main steps for forming a color filter pattern having another color are above given, and other steps can refer to the previous embodiment and here, the detail thereof may be omitted.

After a formation of the color filter pattern having one color, by using the same method, a color filter resin layer having another color is firstly formed in the base substrate, and then, the base substrate is turned over so that the color filter resin layer having another color is in contact with the stage. Then, the mask is disposed directly above the base substrate so as to expose the color filter resin layer.

Herein, light non-transmitting regions of the mask block the light from radiating onto the color filter pattern which is already formed on the base substrate and light transmitting regions thereof are positioned directly above the color filter pattern to be formed, and edges of each of light transmitting regions of the mask are completely aligned with edges of the color filter pattern to be formed or are positioned within a range of the black matrix. After a developing process, the color filter pattern is formed.

The present embodiment provides steps for forming a black matrix and color filter patterns having at least two colors on the base substrate. After a formation of the color filter pattern having one color, because a color filter resin layer directly contacts the stage, the stage may be cleaned in order to ensure a operation environment in which the subsequent steps for forming the color filter substrate are performed clean, the steps in detail comprising:

Rotating the base substrate on which the color filter pattern having the one color is formed by 180 degrees to turn over the base substrate so as to bring the base substrate in contact with the stage;

Removing the base substrate on which the color filter pattern is formed from the stage;

Cleaning the stage.

In addition, in a method of manufacturing the color filter substrate according to an embodiment of the present invention, an exposing process is performed by a lithography equipment, such as, a scanner stepper. Hereinafter, the steps performed by a scanner stepper in detail comprising:

Placing a base substrate in the scanner stepper(Glass Input)→turning over the base substrate (Glass Turn Over)→loading the base substrate on a stage(Glass Loading)→pre-aligning the base substrate(Pre Alignment)→Chucking the base substrate(Glass Chuck)→adjusting a distance between the base substrate and the mask (Gap control)→precisely aligning the base substrate(Alignment)→exposing the base substrate(Exposure)→releasing the base substrate (Chuck Release)→turning over the base substrate(Glass Turn Over)→unloading the base substrate from the stage (Glass Unloading)→automatically cleaning or manually cleaning the stage (Stage Auto Cleaning/Stage manual Cleaning).

Herein, a temperature control device is provided in the scanner stepper to maintain a temperature inside the scanner stepper constant, so that deformations of the base substrate and the mask can be suppressed.

The scanner stepper is provided with a stage for supporting the base substrate, wherein the stage is formed from a non-reflective material in order to avoid exposing light being reflected.

Further, the scanner stepper is provided with a turnover mechanism, so that the base substrate can be rotated 180 degrees inside the scanner stepper.

In addition, the scanner stepper is further provide with a cleaning mechanism, so that a surface of the stage can be cleaned periodically so as to remove residual color filter resin due to direct contacting of the color filter resin and the stage.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A method of manufacturing a color filter substrate, comprising:
    forming a black matrix on a base substrate; and
    forming color filter patterns having at least two colors on the base substrate on which the black matrix is formed, wherein forming a color filter pattern having one color of the at least two colors, comprising:
    forming a color filter resin layer having the one color on the base substrate on which the black matrix is formed;
    applying a negative photoresist layer on the color filter resin layer; and
    radiating the color filter resin layer from a side of the base substrate which is opposite to a side on which the black matrix is formed by using a mask to expose the color filter resin layer so as to form the color filter pattern, wherein light transmitting regions of the mask at least correspond to the color filter pattern to be formed.

2. The method of manufacturing the color filter substrate according to claim 1, wherein each of the light transmitting regions of the mask exceeds outward the corresponding color filter pattern to be formed and edges of each of the light transmitting regions of the mask are positioned within a range of the corresponding black matrix.

3. The method of manufacturing the color filter substrate according to claim 1, wherein the radiating the color filter resin layer from the side of the base substrate which is opposite to the side on which the black matrix is formed by using a mask to expose the color filter resin layer so as to form the color filter pattern comprises:

radiating the color filter resin layer from the side of the base substrate which is opposite to the side on which the black matrix is formed by using a mask to expose the negative photoresist layer, and then, forming a photoresist pattern corresponding to the color filter pattern to be formed on a surface of the color filter resin layer by using a developing process;

etching the color filter resin layer to form the color filter pattern ;

removing the negative photoresist layer on the surface of the color filter pattern.

4. The method of manufacturing the color filter substrate according to claim 1, wherein the radiating the color filter resin layer from the side of the base substrate which is opposite to the side on which the black matrix is formed by using a mask to expose the color filter resin layer so as to form the color filter pattern comprises:

radiating the color filter resin layer from the side of the base substrate which is opposite to the side on which the black matrix is formed by using the mask to expose the color filter resin layer; and forming the color filter pattern by using a developing process, wherein the color filter resin layer is formed from a negative photosensitive material.

5. The method of manufacturing the color filter substrate according to claim 1, wherein the forming the black matrix on the base substrate comprises:

applying a black photoresist layer on the base substrate;

radiating the black photoresist layer from the side of the base substrate on which the black photoresist layer is formed to expose the black photoresist layer; and forming the black matrix by using a developing process.

6. The method of manufacturing the color filter substrate according to claim 1, wherein the forming the black matrix on the base substrate comprises:

depositing a black matrix material layer on the base substrate;

applying a positive photoresist layer on the black matrix material layer;

radiating the black matrix material layer from the side of the base substrate on which the black matrix layer is formed to expose the positive photoresist layer by using a mask, and then, forming a positive photoresist pattern corresponding to the black matrix to be formed by using a developing process, wherein light non-transmitting regions of the mask correspond to the black matrix;

etching the black matrix material layer to form the black matrix; and removing the positive photoresist layer on a surface of the black matrix.

7. The method of manufacturing the color filter substrate according to claim 1, wherein the forming the black matrix on the base substrate comprises:

depositing a black matrix material layer on the base substrate;

applying a negative photoresist layer on the black matrix material layer;

radiating the black matrix material layer from the side of the base substrate on which the black matrix layer is formed to expose the negative photoresist layer by using a mask, and then, forming a negative photoresist pattern corresponding to the black matrix to be formed by using a developing process, wherein light transmitting regions of the mask correspond to the black matrix;

etching the black matrix material layer to form the black matrix; and removing the negative photoresist layer on a surface of the black matrix.

8. The method of manufacturing the color filter substrate according to claim 1, after forming the color filter pattern having one color of the at least two colors and before forming a color filter pattern having the other of the at least two colors, further comprising:

post baking the color filter pattern having the one color of the at least two colors.

* * * * *